United States Patent
Hsieh et al.

(10) Patent No.: US 9,006,040 B2
(45) Date of Patent: Apr. 14, 2015

(54) SYSTEMS AND METHODS FOR FABRICATING SEMICONDUCTOR DEVICES HAVING LARGER DIE DIMENSIONS

(71) Applicant: Taiwan Semiconductor Manufacturing Co. Ltd., Hsin-Chu (TW)

(72) Inventors: Ming-Chang Hsieh, Jhudong Township (TW); Kong-Beng Thei, Pao-Shan Village (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/863,630

(22) Filed: Apr. 16, 2013

(65) Prior Publication Data
US 2014/0264823 A1   Sep. 18, 2014

Related U.S. Application Data

(60) Provisional application No. 61/779,309, filed on Mar. 13, 2013.

(51) Int. Cl.
*G03F 7/20* (2006.01)
*H01L 21/033* (2006.01)

(52) U.S. Cl.
CPC ........ *H01L 21/0338* (2013.01); *H01L 21/0337* (2013.01); *G03F 7/70475* (2013.01)

(58) Field of Classification Search
CPC .................................................. G03F 7/70475
USPC ..................... 257/E21.459, E21.59, E21.599; 438/129
See application file for complete search history.

(56) References Cited

U.S. PATENT DOCUMENTS

| | | | |
|---|---|---|---|
| 6,690,076 B1 * | 2/2004 | Fossum et al. | 257/431 |
| 7,435,533 B2 | 10/2008 | Rockwell et al. | |
| 7,655,363 B2 | 2/2010 | Dai | |
| 7,906,826 B2 * | 3/2011 | Martin et al. | 257/444 |
| 2004/0150805 A1 * | 8/2004 | Iizuka et al. | 355/53 |

* cited by examiner

*Primary Examiner* — John C Ingham
(74) *Attorney, Agent, or Firm* — Eschweiler & Associates, LLC

(57) ABSTRACT

A method of fabricating a semiconductor device is disclosed. A photosensitive material is coated over the device. A plurality of masks for a chip layout are obtained. The plurality of masks are exposed to encompass a chip area of the device using at least one reticle repeatedly. The at least one reticle is of a set of reticles. The chip area has a resultant dimension greater than a dimension of the at least one reticle. A developer is used to remove soluble portions of the photosensitive material forming a resist pattern in the chip area.

18 Claims, 5 Drawing Sheets

US 9,006,040 B2

SYSTEMS AND METHODS FOR FABRICATING SEMICONDUCTOR DEVICES HAVING LARGER DIE DIMENSIONS

CROSS REFERENCE TO RELATED APPLICATION

This application is a Non-Provisional patent application claiming priority to U.S. Provisional Patent Application Ser. No. 61/779,309 filed Mar. 13, 2013 and is entitled "Systems and Methods for Fabricating Semiconductor Devices Having Larger Die Dimensions" in the name of Ming-Chang Hsieh, et al.; and is hereby incorporated by reference.

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

Photolithographic steps are processes used to pattern parts of a thin film or layer on a device. A reticle or photoreticle is used to transfer a geometric pattern using a photomask to expose a light sensitive material, referred to as photoresist. Other chemical treatments are then performed to selectively etch material from a semiconductor device and/or to selectively deposit material on/over a semiconductor device.

The photomask is a two dimensional image defining a pattern layer or deposition layer. The photomask is dimensioned to match the reticle. Thus, the photomask has a length and width that correspond to the physical length and width of the reticle.

Generally, formation of an integrated circuit is limited by the size of the photomask. As a consequence, the integrated circuit is also limited by the size of the reticle.

DETAILED DESCRIPTION

Figure 1:
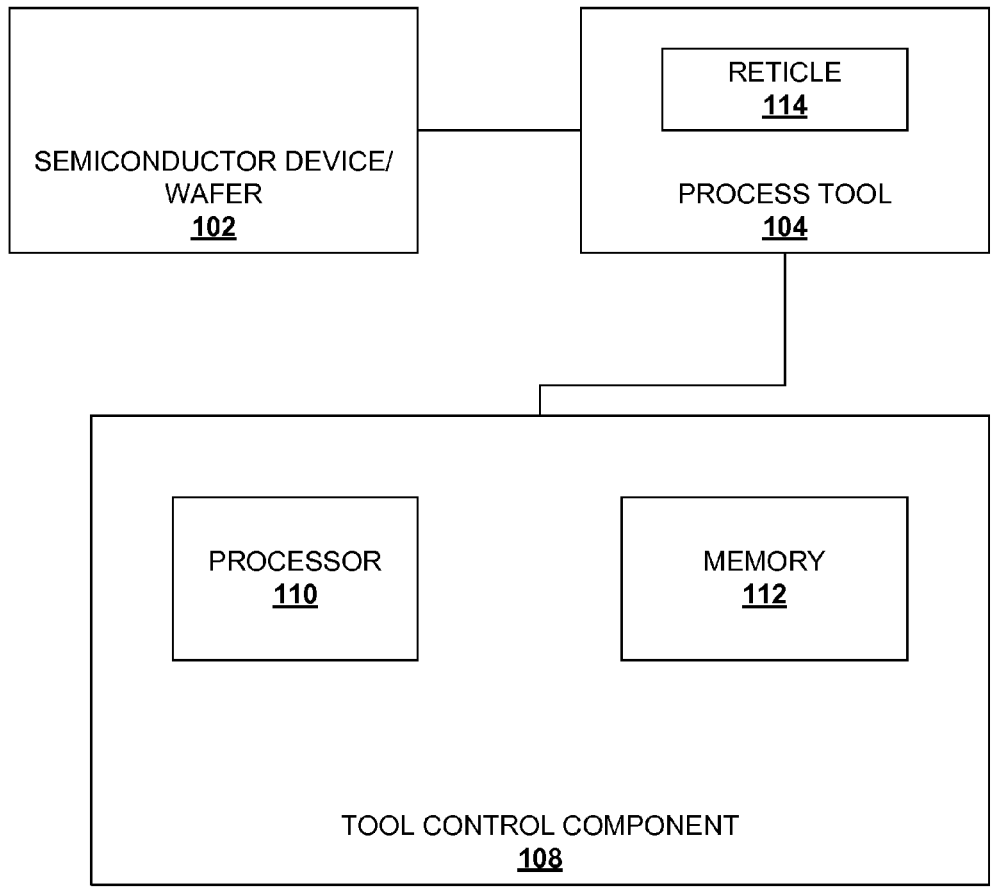
FIG. 1 is a block diagram illustrating a semiconductor device fabrication system in accordance with an embodiment of this disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Generally, semiconductor fabrication involves performing a relatively large number or process steps on a wafer or semiconductor material in order to produce a desired semiconductor integrated circuit. The fabrication process is a multiple-step sequence of photolithographic and chemical processing steps during which electronic circuits are gradually created on a wafer composed of a semiconducting material.

The process steps can be broken down into front end of line (FEOL) processing and back end of line (BEOL) processing. In one example, over 300 sequenced process steps are required to form an integrated circuit on a semiconductor wafer.

FIG. 1 is a block diagram illustrating a semiconductor device fabrication system 100 in accordance with an embodiment of this disclosure. The system 100 is configured to perform semiconductor fabrication processes on semiconductor devices or wafers. The system 100 is configured to fabricate individual devices having dimensions that exceed the dimensions of a reticle used in the system for photolithography.

The system 100 includes a process tool 104 and a tool control component 108. The system operations on a semiconductor device or wafer 102. The semiconductor device 102 can include multi-wafer devices, micro-electro-mechanical devices, and the like. The device 102 can be partially formed and include an effective die area, trench areas, metal pad areas, and the like.

The tool control component 108 includes a processor 110 and a memory 112. The processor 110 executes instructions to perform selected fabrication processes. The memory 112 may store program instructions, process data, and the like. The tool control component 108 controls the process tool 104.

The process tool 104 performs one or more fabrication processes on the device 102. One of the processes performed is a photolithographic process used to selectively pattern or deposit material on the device 102. The process tool 104 includes a reticle 114, which is used to expose portions of the device 102 using a photomask. The reticle 114 is utilized to fabricate individual circuits or devices according to a chip layout. The reticle 114 is typically one of a set of reticles usable by the process tool 104.

The chip layout is the design for individual die or devices on the semiconductor device 102. The chip layout includes individual fabricated components, such as transistors, pad areas, trench areas, discrete components, input output sections, and the like. In conventional systems, chip layouts are limited by the size of the reticle. For example, a conventional fabrication system using a reticle having a width of 32 mm is limited to chip layouts of 32 mm or less.

In contrast, the process tool 104 is configured to utilize chip layouts that exceed physical dimensions of the reticle 114. For example, if the reticle has a width of 32 mm, a chip layout having a width of 64 mm can be utilized. As a result, individual die can be fabricated having sizes that exceed the physical dimensions of the reticle 114.

The process tool 104 uses multiple exposures with the reticle 114 to cover a larger area than it's physical size. Additional details on suitable techniques to perform this are described below.

Figure 2A:
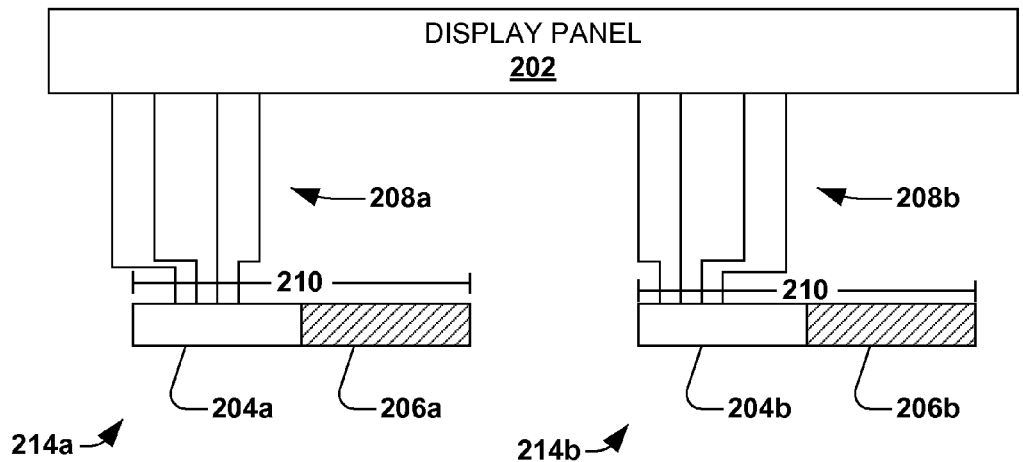
FIG. 2A is a block diagram illustrating an example display panel arrangement.
Figure 2B:
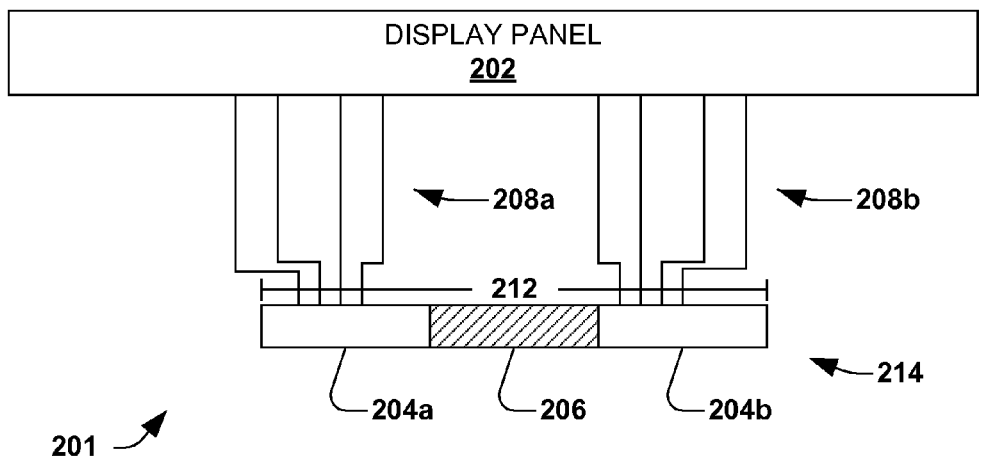
FIG. 2B is a block diagram illustrating a display arrangement wherein multiple I/O portions are fit onto a single die in accordance with an embodiment of this disclosure.

FIGS. 2A and 2B depict an example comparing integrated circuits of varied sizes. These are provided as examples to facilitate understanding.

FIG. 2A is a block diagram illustrating a display panel arrangement 200. The arrangement 200 shows integrated circuits formed with a relatively smaller dimension (width) and its impact on the overall arrangement.

The display panel arrangement 200 includes a display panel 202, a first chip 214a and a second chip 214b. The first chip 214a includes a first I/O portion 204a and a first logic area 206a. The second chip 214b includes a second I/O portion 204b and a second logic area 206b. The first I/O portion 204a is connected to the display panel 202 by first interconnects 208a. The second I/O portion 204b is connected to the display panel by second interconnects 208b.

The first chip 214a and the second chip 214b have a die width 210. In this example, the width 210 is limited. The first and second I/O portions 204a, 204b require substantial die width such that there is insufficient area on a single die of width 210 to fit the I/O portions 204a, 204b and the logic portions. As a result, they cannot be fit onto a single chip and both the first and second chips 214a, 214b are needed. At least portions of the first and second logic areas 206a, 206b are repeated.

Using two chips accommodates the I/O portions; however there are several detrimental factors. The two chips require more device room or volume than necessary. There may be an overall increase in cost due to making and using two chips instead of one. There may also be other detrimental factors.

FIG. 2B is a block diagram illustrating a display arrangement 201 wherein multiple I/O portions are fit onto a single die. The arrangement 201 shows an integrated circuit with a relatively larger dimension (width) and its impact on the overall arrangement.

The display panel arrangement 201 includes a display panel 202 and a single chip 214. The chip 214 includes a first I/O portion 204a and a single logic area 206, and a second I/O portion 204b. The first I/O portion 204a is connected to the display panel 202 by first interconnects 208a. The second I/O portion 204b is connected to the display panel by second interconnects 208b.

The chip 214 has the relatively larger die width, which is sufficient to accommodate the first I/O portion 204a, the single logic area 206, and the second I/O portion 204b. The I/O portions 204a, 204b require substantial die area, however the larger dimension 212 permits them being on the same die. As a result, cost savings and the like can be attained by using a single die, instead of the two dies described in FIG. 2A.

Figure 3:
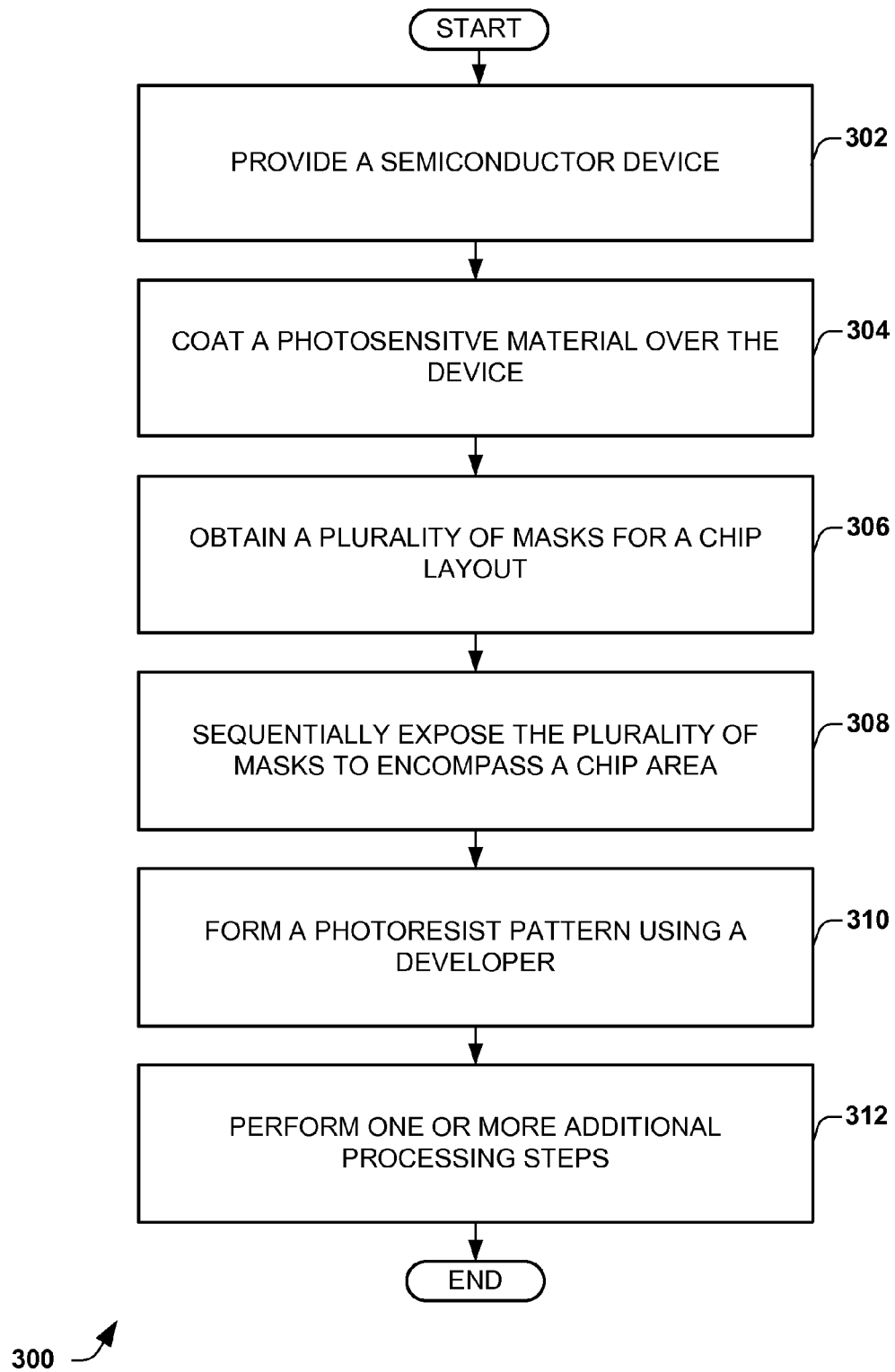
FIG. 3 is a flow diagram illustrating a method 300 of fabricating a semiconductor device having a layout dimension greater than a reticle or photoreticle in accordance with an embodiment of this disclosure.

FIG. 3 is a flow diagram illustrating a method 300 of fabricating a semiconductor device having a layout dimension greater than a reticle or photoreticle in accordance with an embodiment of this disclosure. The method 300 facilitates device patterning by using multiple exposures to overcome a die size limitation or a reticle or photolithographic tool.

The method 300 begins at block 302, wherein a semiconductor device is provided. The device can include a partially formed device having a plurality of layers structures formed thereon. For example, the device can have one or more front end of line processing steps already performed.

A photosensitive material is coated over the device at block 304. The photosensitive material includes a layer of resist or photo resist. The photosensitive material is sensitive to light and can be positive or negative. A negative photosensitive material is one where the portion exposed to light becomes insoluble to a photoresist developer and the portion not exposed to light is soluble to the photoresist developer. A positive photoresist material is one where the portion exposed to light becomes soluble to a photoresist developer and the portion not exposed to light is insoluble to the photoresist developer.

A plurality of masks for a chip layout are obtained at block 306. Each mask has a dimension limited by a reticle and/or photolithographic tool dimension. Each mask can be described in terms of having a mask layout. For example, if the reticle has a width of 32 mm, each mask has a similar dimension. However, the chip layout combines multiple masks to yield a layout greater than the reticle dimension and/or the mask dimension. Continuing the example, the chip layout has 3 masks, each having a width of 32 mm for a total layout width of 96 mm.

The chip layout includes the plurality of masks and an arrangement for the masks. The number and arrangement of the masks can vary. For example, the masks can be arranged in a number of columns and rows. Each mask has a similar width and length. The masks are arranged to yield the chip layout having a selected width and length.

Further, the individual masks can correspond to different portions or areas of a chip layout. In one example, a first mask corresponds to a first input/output portion, a second mask corresponds to a second input/output portion, and a third mask corresponds to a logic area.

Figure 4:
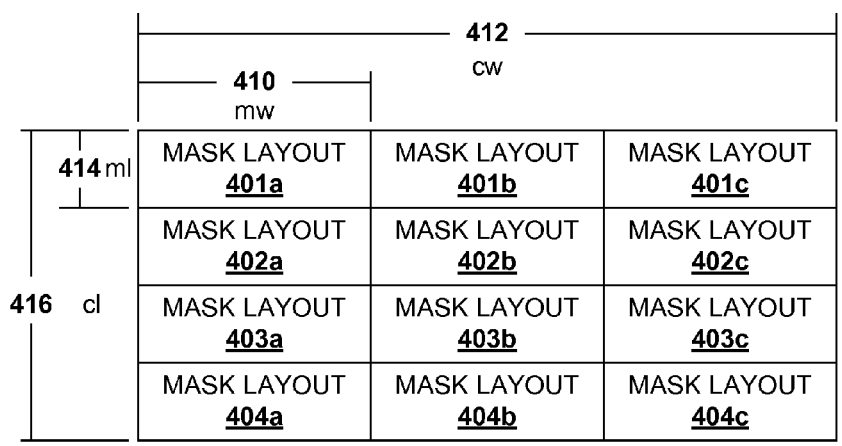
FIG. 4 is a diagram illustrating an example arrangement of mask layouts in accordance with an embodiment of the disclosure.

FIG. 4 is a diagram illustrating an example mask layout arrangement 400 of mask layouts in accordance with an embodiment of the disclosure. Here, the arrangement 400 includes 3 columns and 4 rows.

Each mask is shown with a width 410, designated as "mw", and a length 414, designated as "ml". The mask dimensions correspond and are limited by reticle dimensions. The arrangement 400, as well as the chip layout, has a width 412, designated as "cw", and a length 416, designated as "cl". As can be seen, the chip layout has dimensions 412 and 416 that exceed the mask layout dimensions and, necessarily, the reticle dimensions.

It is appreciated that other arrangements are contemplated with varying mask sizes, number of columns, number of rows, and layout dimensions. It is also appreciated that the number of columns or rows can be equal to one. It is further appreciated that individual masks or mask layouts can have varied dimensions from each other.

Additionally, the mask layouts, like the masks may correspond to different portions or areas of a chip layout. In one example, a first mask layout corresponds to a first logic portion and a second mask layout correspond to a second logic portion.

Returning to the method 300 and FIG. 3, the plurality of masks are sequentially exposed using a photo exposure process to encompass a chip area at block 308. Each mask is exposed using the photolithographic tool and the reticle or a plurality of reticles of a set of reticles. The position for each mask exposure depends on the chip layout and the arrangement for the chip layout. The masks are exposed sequentially and positionally according to the arrangement for the chip layout.

Figure 5:
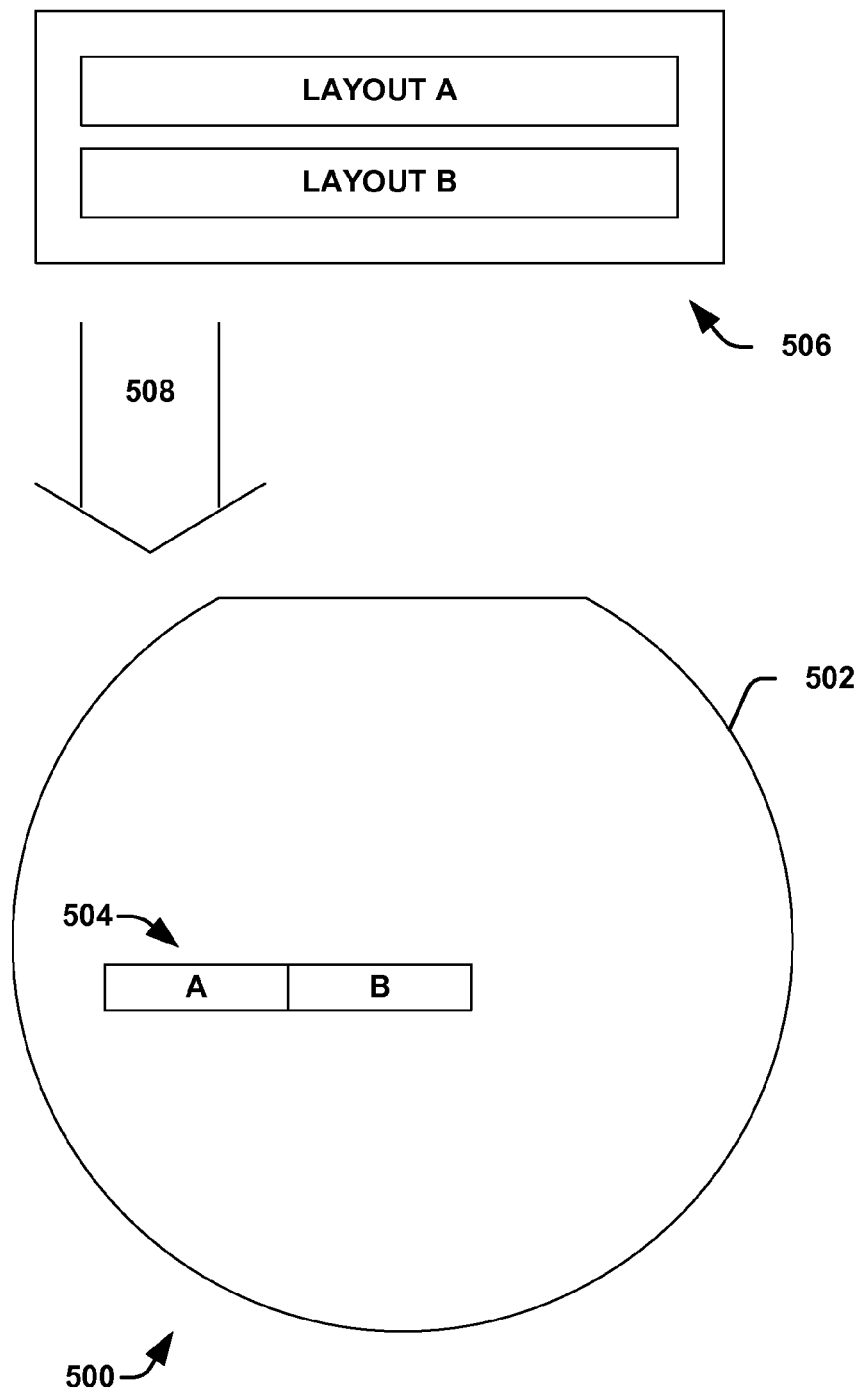
FIG. 5 is a diagram illustrating multiple mask exposures for a single chip layout in accordance with an embodiment of the disclosure.

FIG. 5 is a diagram 500 illustrating multiple mask exposures for a single chip layout in accordance with an embodiment of the disclosure. The diagram 500 is presented for illustrative purposes and it is appreciated that other layouts and masks can be utilized in accordance with this disclosure.

A plurality of mask layouts are ordered in a sequence 506 for exposure using a reticle and photolithographic tool. The sequence 506 includes the order in which the plurality of mask layouts are to be exposed. Here, the mask layouts includes layout A and layout B. In the sequence 506, a mask for layout A is exposed and then a mask for layout B.

The masks are sequentially exposed onto a semiconductor wafer 502 using an exposure process 508, such as described in block 308. Each exposure is at specified position such that the layout B is to the right of the layout A, as shown in FIG. 5. The multiple exposures result in a total exposure covering a chip area 504.

It is appreciated that varied numbers of mask layouts and arrangements are contemplated.

Returning to FIG. 3, a photoresist pattern is formed using a developer at block 310. The formed pattern occupies the area exposed during block 308. It is noted that the formed pattern is larger in at least one dimension than the dimensions of the reticle and/or the photolithographic tool.

If the photosensitive material is positive, then the developer removes portions exposed to light. If the photosensitive material is negative, then the developer removed portions not exposed to light.

Additional processing steps may be performed at block 312. The steps can include other layers, structures, interconnects, and the like. The steps at least partially fabricate the device having die dimensions that exceed one or more dimensions of the reticle and/or photolithographic tool.

It will be appreciated that while reference is made throughout this document to exemplary structures in discussing aspects of methodologies described herein (e.g., the structure presented in above figures, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A method of fabricating a semiconductor device is disclosed. A photosensitive material is coated over the device. A plurality of masks for a chip layout are obtained. The plurality of masks are exposed to encompass a chip area of the device using a reticle repeatedly. The chip area having a resultant dimension greater than a dimension of the reticle. A developer is used to remove soluble portions of the photosensitive material forming a resist pattern in the chip area.

A mask layout arrangement includes a plurality of mask layouts, one or more rows of the mask layouts, one or more columns of the mask layouts, wherein the mask layouts have a length and width correlated to a reticle length and a reticle width.

A single die display arrangement includes a display panel, a single chip, first interconnects, and second interconnects. The single chip includes a first input/output portion, a logic area, and a second input/output portion. The single chip at least partially formed using a reticle. The first interconnect is connected to the display panel and the first input/output portion of the single chip. The second interconnect is connected to the display panel and the second input/output portion of the single chip. The single chip has a dimension that exceeds a corresponding dimension of the reticle, such as a reticle width.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of fabricating a semiconductor device, the method comprising:

coating a photosensitive material over the device;

positioning at least one reticle, which has a dimension, at a plurality of reticle locations over the photosensitive material according to a sequence to form a plurality of masks, respectfully;

for each reticle location in the sequence, selectively exposing the photosensitive material underlying the reticle to electromagnetic radiation;

using a developer to develop the selectively exposed photosensitive material to provide a photoresist pattern which is made up of the plurality of masks that collectively encompass a chip area of the device, wherein the plurality of masks touch one another at their respective edges, and wherein the chip area has a dimension larger than the dimension of the at least one reticle; and applying a chemical treatment to the photoresist pattern to selectively etch or deposit a conductive layer over or within the device in accordance with the photoresist pattern, wherein the selectively etched or deposited conductive layer includes a plurality of regions corresponding to the plurality of masks, and wherein the plurality of regions are electrically coupled to each other.

2. The method of claim 1, further comprising performing one or more additional processing steps.

3. The method of claim 1, wherein coating the photosensitive material includes depositing a photoresist on the device.

4. The method of claim 1, wherein the plurality of masks include a mask for a logic portion.

5. The method of claim 1, wherein the plurality of masks include a mask for an input/output portion.

6. The method of claim 1, wherein the plurality of masks include a first mask for a logic portion, a second mask for a first input/output portion, and a third mask for a second input/output portion.

7. The method of claim 1, wherein the plurality of masks are arranged according to the chip layout.

8. The method of claim 1, wherein the chip area has a width greater than a width of the reticle.

9. The method of claim 8, wherein the width of the reticle is less than or equal to 32 mm.

10. The method of claim 1, wherein the chip area has a length greater than a length of the reticle.

11. The method according to claim 1, wherein the plurality of masks include a first mask and a second mask, the first mask including a first mask layout, and the second mask including a second mask layout connected to the first mask layout, and wherein the method further includes:

performing an etch into the device according to the photoresist pattern to form a representation of the first mask layout and to form a representation of the second mask layout connected to the first mask layout in the conductive layer.

12. The method of claim 11, wherein the first mask layout includes an input/output portion of the chip layout configured to connect to the semiconductor device to an external display panel external to the semiconductor device, wherein the second mask layout includes a logic portion of the chip layout that is connected to the input/output portion, and wherein the method further includes:
    performing the etch into the device according to the photoresist pattern to form a representation of the logic portion and to form a representation of the input/output portion connected to the logic portion in the conductive layer; and
    forming an electrical interconnect connecting the input/output portion to the external display panel.

13. A mask layout arrangement comprising:
    a plurality of mask layouts each touching and electrically connected to at least one other mask layout of the plurality of mask layouts;
    one or more rows of the mask layouts;
    one or more columns of the mask layouts; and
    wherein the mask layouts have individual lengths and individual widths correlated to a reticle length and a reticle width of at least one reticle of a set of reticles, wherein the mask layouts share approximately the same widths and lengths; and
    wherein the plurality of mask layouts collectively define a chip width and a chip length according to the number of columns and the number of rows.

14. The mask layout arrangement of claim 13, wherein the plurality of mask layouts includes mask layouts configured to provide input/output between a semiconductor device and an external device external to the semiconductor device.

15. The mask layout arrangement of claim 13, wherein the plurality of mask layouts includes a mask layout corresponding to a logic area.

16. A single die arrangement comprising:
    a single chip formed using a reticle of a set of reticles, the single chip including a layer arranged over a semiconductor substrate, the layer including a first input/output portion, a logic area, and a second input/output portion independent of the first input/output portion, the first input/output portion and the second input/output portion arranged on opposite sides of the logic area, the first input/output portion and the second input/output portion electrically connected to the logic area in the layer, and the first and second input/output portions configured to electrically couple the logic area to an external display panel external to the single die arrangement;
    first interconnects electrically connected between the external display panel and the first input/output portion; and
    second interconnects electrically connected between the external display panel and the second input/output portion;
    wherein the single chip has a dimension that exceeds a corresponding dimension of the reticle.

17. The arrangement of claim 16, wherein the first input/output portion and the logic area have a width greater than a width of the reticle.

18. The arrangement of claim 16, wherein the logic area is used by both the first input/output portion and the second input/output portion.

* * * * *